United States Patent
Kim et al.

(10) Patent No.: US 12,094,692 B2
(45) Date of Patent: Sep. 17, 2024

(54) FOCUS RING AND APPARATUS FOR PROCESSING A SUBSTRATE INCLUDING A FOCUS RING

(71) Applicant: Semes Co., Ltd., Cheonan-si (KR)

(72) Inventors: Jinhyeok Kim, Pohang-si (KR); Dongmok Lee, Cheonan-si (KR); Yeonghun Wi, Busan (KR); Yonghyun Ham, Bucheon-si (KR); Yeonggyo Jeong, Anyang-si (KR)

(73) Assignee: Semes Co., Ltd., Cheonan-si (KR)

( * ) Notice: Subject to any disclaimer, the term of this patent is extended or adjusted under 35 U.S.C. 154(b) by 366 days.

(21) Appl. No.: 17/455,501

(22) Filed: Nov. 18, 2021

(65) Prior Publication Data
US 2022/0199375 A1   Jun. 23, 2022

(30) Foreign Application Priority Data
Dec. 23, 2020   (KR) .................. 10-2020-0181873

(51) Int. Cl.
   *H01J 37/32*   (2006.01)
(52) U.S. Cl.
   CPC ... *H01J 37/32642* (2013.01); *H01J 2237/334* (2013.01)
(58) Field of Classification Search
   CPC .......... H01J 37/32642; H01J 2237/334; H01J 37/3244; H01J 37/32715; H01J 2237/3341; H01L 21/67069
   See application file for complete search history.

(56) References Cited

U.S. PATENT DOCUMENTS

| | | | | |
|---|---|---|---|---|
| 2019/0355611 A1* | 11/2019 | Kim | .................. | H01J 37/32642 |
| 2020/0395195 A1* | 12/2020 | Sanchez | ............ | H01L 21/68742 |
| 2022/0328290 A1* | 10/2022 | Mishra | .............. | H01J 37/32385 |

FOREIGN PATENT DOCUMENTS

KR   10-2015-0073123 A   6/2015

\* cited by examiner

*Primary Examiner* — Christopher W Raimund
(74) *Attorney, Agent, or Firm* — DALY, CROWLEY, MOFFORD & DURKEE, LLP

(57) ABSTRACT

An apparatus for processing a substrate may include a processing module including at least one process chamber for performing a desired process on a substrate and an index module transferring the substrate into the processing module from an outside. The at least one process chamber may include a housing providing a process space therein, a supporting unit disposed in the housing to support a substrate, the supporting unit including a focus ring having a plurality of rings, a gas supply unit providing a process gas into the process space, and a plasma generating unit generating a plasma from the process gas in the process space. The focus ring may include a stepped structure having a plurality of stepped portions downwardly provided toward the substrate.

11 Claims, 3 Drawing Sheets

US 12,094,692 B2

FOCUS RING AND APPARATUS FOR PROCESSING A SUBSTRATE INCLUDING A FOCUS RING

CROSS-REFERENCE TO RELATED APPLICATION

This application claims priority to Korean Patent Application No. 10-2020-0181873 filed on Dec. 23, 2020 in the Korean Intellectual Property Office (KIPO), the contents of which are herein incorporated by reference in its entirety.

BACKGROUND

1. Field

Example embodiments of the invention relate to a focus ring and an apparatus for processing a substrate including a focus ring. More particularly, example embodiments of the invention relate to a focus ring having a stepped structure and an apparatus for processing a substrate including such a focus ring.

2. Related Technology

An integrated circuit device or a display device can be usually manufactured using an apparatus for processing a substrate including various process chambers such as a deposition chamber, a sputtering chamber, an etching chamber, a cleaning chamber, a drying chamber, etc. The components included in the process chamber may be damaged while various processes are performed in the process chamber. Particularly, when a plasma etching process is performed on a substrate in the process chamber, a focus ring for directing a plasma onto the substrate may be easily damaged, and thus the lifetime of the focus ring may be shortened. For example, the conventional focus ring including an inner ring of silicon carbide and an outer ring of silicon oxide may be easily damaged by a plasma generated from an etching gas containing fluorine such that the lifetime of the focusing ring may be reduced due to such damage.

SUMMARY

In one aspect of the invention, there is provided a focus ring including a stepped structure for improving the lifetime thereof.

In another aspect of the invention, there is provided a process chamber including a focus ring having a stepped structure for improving the lifetime thereof.

In still another aspect of the invention, there is provided an apparatus for processing a substrate including a focus ring having a stepped structure for improving the lifetime thereof.

According to one aspect of the invention, there is provided a focus ring including a first ring contacting a substrate, a second ring coupled to the first ring, a third ring coupled to the second ring, and a stepped structure provided between the second ring and the third ring.

In example embodiment, the first ring may have a first etching rate, the second ring may have a second etching rate, and the third ring may have a third etching rate. In this case, with respect to an etching gas including fluorine, the first etching rate may be substantially the same as the second etching rate, and the third etching rate may be substantially greater than the first etching rate and the second etching rate.

For example, each of the first ring and the second ring may include silicon carbide and the third ring may include silicon oxide.

In example embodiment, the stepped structure may be formed at an interface between the second ring and the third ring, at a side of the second ring, or at a side of the third ring.

In example embodiment, the stepped structure may be downwardly disposed toward the substrate.

In example embodiment, the stepped structure may include a plurality of stepped portions. In this case, the stepped structure may include a first stepped portion, a second stepped portion, a third stepped portion and a fourth stepped portion, which may be downwardly disposed toward the substrate. Further, the first to the fourth stepped portions may have depths substantially increased toward the substrate and widths substantially decreased toward the substrate, respectively. For example, the first stepped portion may have a first depth and a first width, the second stepped portion may have a second depth substantially greater than the first depth and a second width substantially smaller than the first width, the third stepped portion may have a third depth substantially greater than the second depth and a third width substantially smaller than the second width, and the fourth stepped portion may have a fourth depth substantially greater than the third depth and a fourth substantially smaller than the third depth.

In example embodiment, a coupling stepped structure may be provided at a lower portion of the first ring for a stable coupling of the focus ring relative to the substrate.

According to another aspect of the invention, there is provided a process chamber including a housing providing a process space therein, a supporting unit disposed in the housing to support a substrate, the supporting unit including a focus ring having a plurality of rings, a gas supply unit providing a process gas into the process space, and a plasma generating unit generating a plasma from the process gas in the process space. In this case, the focus ring may include a stepped structure having a plurality of stepped portions downwardly provided toward the substrate.

In example embodiment, the focus ring may include a first ring, a second ring coupled to the first ring and a third ring coupled to the second ring. Further, the stepped structure may be provided between the second ring and the third ring. For example, the stepped structure may be formed at an interface between the second ring and the third ring, at a side of the second ring, or at a side of the third ring.

In example embodiment, the stepped structure may include a first stepped portion, a second stepped portion, a third stepped portion and a fourth stepped portion, which may be downwardly disposed toward the substrate. In this case, the first to the fourth stepped portions may have depths substantially increased toward the substrate and widths substantially decreased toward the substrate, respectively. For example, the first stepped portion may have a first depth and a first width, the second stepped portion may have a second depth substantially greater than the first depth and a second width substantially smaller than the first width, the third stepped portion may have a third depth substantially greater than the second depth and a third width substantially smaller than the second width, and the fourth stepped portion may have a fourth depth substantially greater than the third depth and a fourth substantially smaller than the third depth.

According to still another aspect of the invention, there is provided an apparatus for processing a substrate. The apparatus for processing a substrate may include a processing module including at least one process chamber for performing a desired process on a substrate and an index module transferring the substrate into the processing module from an outside. The at least one process chamber may include a housing providing a process space therein, a supporting unit disposed in the housing to support a substrate, the supporting unit including a focus ring having a plurality of rings, a gas supply unit providing a process gas into the process space, and a plasma generating unit generating a plasma from the process gas in the process space. In this case, the focus ring may include a stepped structure having a plurality of stepped portions downwardly provided toward the substrate.

In example embodiment, the stepped structure may include a first stepped portion, a second stepped portion, a third stepped portion and a fourth stepped portion, which are downwardly disposed toward the substrate. In this case, the first stepped portion to the fourth stepped portion may have depths substantially increased toward the substrate and widths substantially decreased toward the substrate, respectively.

According to example embodiments, the focus ring may include the stepped portions having the depths downwardly increased toward the substrate and the widths downwardly decreased toward the substrate. Therefore, the propagation of damages toward the side and/or the center of the focus ring may be effectively prevented even though the damages generate by the plasma at the portion between the second ring and the third ring in the plasma etching process performed using the focus ring. Accordingly, the etching resistance and the durability the focus ring including the stepped portions may be greatly enhanced. As a result, the focus ring may ensure greatly increased lifetime and also the process chamber including the focus ring and the apparatus for processing a substrate including the focus ring may have considerably increased lifetimes, respectively.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
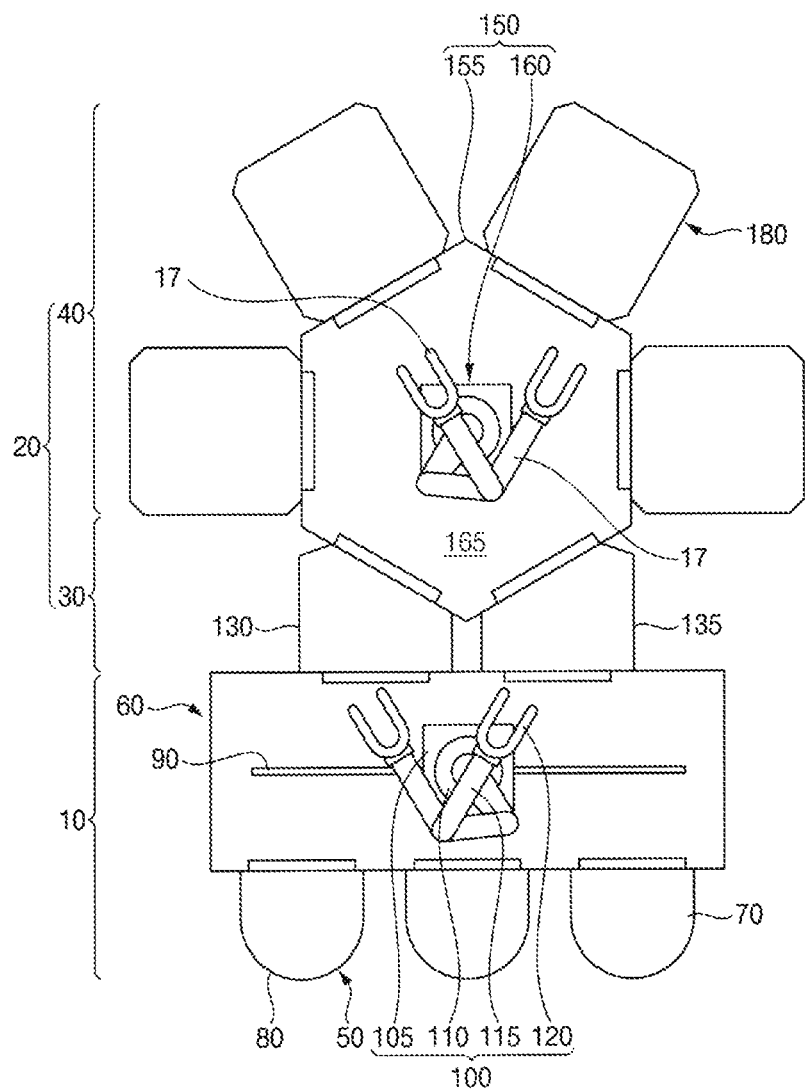
FIG. 1 is a plane view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

FIG. 1 is a plane view illustrating an apparatus for processing a substrate in accordance with example embodiments of the invention.

Referring to FIG. 1, the apparatus for processing a substrate according to example embodiments may include an index module 10 and a processing module 20. The processing module 20 may include a load lock module 30 and a process module 40.

The index module 10 may include a load port 50 and a transferring frame 60. A cassette 70 for receiving a plurality of substrates may be placed on the load port 50. For example, the cassette 70 may include a front opening unified pod (FOUP). In example embodiments, the index module 10 may include a plurality of load ports 50.

The index module 10 may include a carrier storing unit 80. The carrier storing unit 80 may have a structure similar to that of the cassette 70. The carrier storing unit 80 may be disposed such that the carrier storing unit 80 may adjacent to the load port 50. However, the position of the carrier storing unit 80 may vary in accordance with the configuration of the apparatus for processing a substrate.

The transferring frame 60 may transfer the substrate between the load lock module 30 and the cassette 70 received on the load port 50. The transferring frame 60 may include an index rail 90 and an index robot 100. The index robot 100 may move along the index rail 90 such that the index robot 100 may transfer the substrate between the load lock module 30 and the cassette 70.

The index robot 100 may include an index robot base 105, a body 110, an index robot arm 115 and an index hand 120. The index robot base 105 may move on the index rail 90. The body 110 may be coupled to the index robot base 105 so that the body 110 may move along with the index robot base 105. Additionally, the body 110 may rotate on the index robot base 105. The index robot arm 115 may be coupled to the body 110 and may move or rotate on the body 110. In example embodiments, the index robot 100 may include a plurality of index robot arms 115 which may separately operate. Here, some of the plurality of index robots 115 may transfer the substrates from the process module 40 into the cassette 70 while other of the plurality of index robots 115 may transfer the substrates from the cassette 70 into the process module 40.

The load lock module 30 may be disposed between the transferring frame 60 and a transferring unit 150. The load lock module 30 may provide a space for accommodating the substrate(s) transferred between the transferring unit 150 and the transferring frame 60. The load lock module 30 may maintain a pressure of the index module 10 to be substantially the same as a pressure of the processing module 40 while transferring the substrate(s) from the index module 10 into the processing module 40. For example, the load lock module 30 may keep a substantial vacuum pressure in an inside of the index module 10. Further, the load lock module 30 may maintain the pressure of the processing module 40 to be substantially the same as the pressure of the index module 10 while transferring the substrate(s) from the processing module 40 to the index module 10.

The load lock module 30 may include a load lock chamber 130 and an unload lock chamber 135. The substrate transferred from the index module 10 into the processing module 40 may temporarily received in the load lock chamber 130. The substrate transferred from the processing module 40 into the index module 10 may temporarily received in the unload lock chamber 135.

The processing module 40 may include the transferring unit 150 and a plurality of process chambers 180.

The transferring unit 150 may transfer the substrate among the load lock chamber 130, the unload lock chamber 135 and the process chambers 180. The transferring unit 150 may include a transferring chamber 155 and a transferring robot 160. The load lock chamber 130, the unload lock chamber 135 and the process chambers 180 may be disposed centering the transferring chamber 155. The transferring chamber 155 may provide a transferring space 165 for accommodating the substrate.

The transferring robot 160 may be disposed in the transferring space 165 such that the transferring robot 160 may transfer the substrate among the load lock chamber 130, the unload lock chamber 135 and the process chambers 180. The transferring robot 160 may include a transferring robot arm 170 and a transferring hand 175 for transferring the substrate. Alternatively, the transferring robot 160 may include a plurality of transferring robot arms 170 and a plurality of transferring hands 175.

In example embodiments, the apparatus for processing a substrate may include the plurality of process chambers 180. The process chambers 180 may include, but not limited to, an etching chamber, a deposition chamber, a cleaning chamber, a drying chamber, a coating chamber, a developing chamber, an exposure chamber, etc. In the process chambers 180, desired processes including a deposition process, an etching process, a cleaning process, a coating process, a developing process and/or an exposure process may be performed on the substrate.

Figure 2:
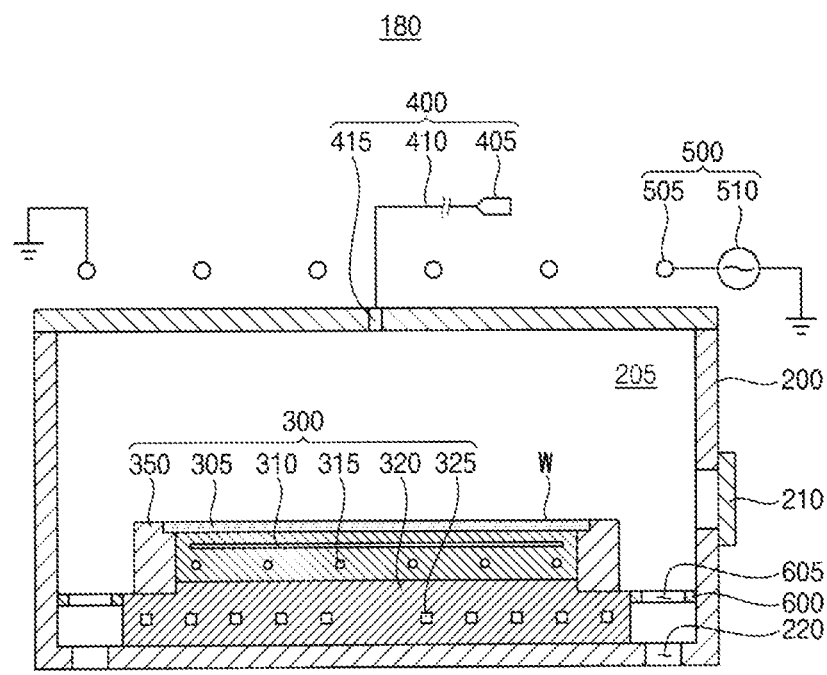
FIG. 2 is a cross-sectional view illustrating a process chamber of an apparatus for processing a substrate in accordance with example embodiments of the invention.

FIG. 2 is a cross-sectional view illustrating a process chamber of an apparatus for processing a substrate in accordance with example embodiments of the invention. In example embodiments, the process may include a plasma etching chamber.

Referring to FIG. 2, the process chamber 100 of the apparatus for processing a substrate may include a housing 200, a supporting unit 300, a gas supply unit 400, a plasma generating unit 500, an exhausting unit 600, etc.

The housing 200 may provide a process space 205 in which the desired process such as the etching process may be performed on a substrate W. The housing 200 may have a substantially cylindrical shape and, for example, may include metal such as aluminum. An opening may be provided at one side of the housing 200 for the loading and unloading of the substrate W into and from the process space 205. Such opening may be opened and closed by a door 210. A hole 220 may be provided at a bottom of the housing 200. A vacuum member (not illustrated) may be connected to the hole 220 so that the inside of the process space 205 may hold substantial vacuum by the vacuum member, for example, a vacuum pump.

The supporting unit 300 may be disposed in the process space 205 of the housing 200. For example, the supporting unit 300 may support the substrate W while a plasma etching process is performed on the substrate W to form desired structures including circuit patterns on the substrate W. In example embodiments, the supporting unit 300 may include an electrostatic chuck for supporting the substrate W by applying an electrostatic force to a bottom of the substrate W. Alternatively, the supporting unit 300 may hold the substrate W in a clamping manner.

In example embodiments, when the supporting unit 300 includes the electrostatic chuck, the supporting unit 300 may include a dielectric plate 305, an inner electrode 310, a heater 315, a base 320, a cooling flow path 325 and a focus ring 350.

The dielectric plate 305 may include dielectric material and the substrate W may locate on the dielectric plate 305. The dielectric plate 305 may have a substantially circular plate shape. The dielectric plate 305 may have a diameter substantially the same as a diameter of the substrate W or may have a diameter substantially smaller than the diameter of the substrate W. The dimensions of the dielectric plate 305 may vary in accordance with the dimensions of the substrate W.

The inner electrode 310 may be disposed in the dielectric plate 305. The inner electrode 310 may receive a power from a power source (not illustrated) such that the electrostatic force may generate between the dielectric plate 305 and the substrate W. In addition, the heater 315 may be installed in the dielectric plate 305 for heating the substrate W. For example, the heater 315 may include a spiral coil.

The base 320 may be coupled to the dielectric plate 305 so that the base 320 may support the dielectric plate 305. The base 320 may have a central portion substantially higher that a peripheral portion thereof. In this case, the central portion of the base 320 may have a size substantially the same as a side of the dielectric plate 305. For example, the base 320 may include metal.

The cooling flow path 325 may be provided in the base 320. A cooling fluid may be circulated through the cooling flow path 325 for cooling the supporting unit 300. For example, the cooling flow path 325 may have a substantially spiral shape.

The base 320 may be electrically connected to an external high frequency power source (not illustrated). The high frequency power source may apply a predetermined power to the base 165 such that a plasma generated from a process gas introduced into the process space 205 of the housing 200 by the applied power may be directed toward the base 320.

At least one focus ring 350 may be disposed over the peripheral portion of the base 320. The at least one focus ring 350 may concentrate the plasma generated from the process gas onto the substrate W. The at least one focus ring 350 may substantially surround the dielectric plate 305 and the substrate W. For example, the dielectric plate 305 and the substrate W may be placed on a central portion of the at least one focus ring 350. The substrate W may be maintained in place by the focus ring 350 having the above structure. Additionally, the focus ring 350 may extend an area where an electric field is generated in the process space 205 such that the substrate W may be positioned at a central portion of the process space 205 in which the plasma is produced.

Figure 3:
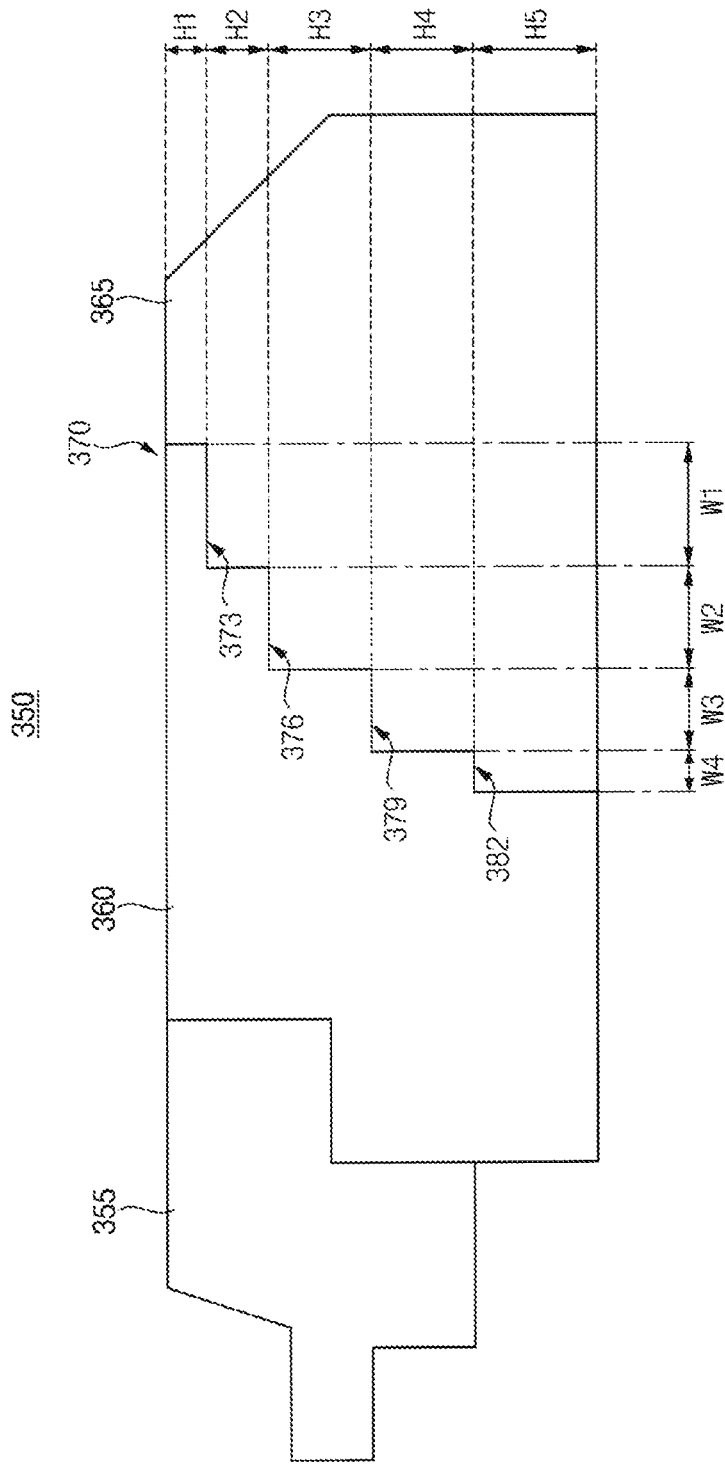
FIG. 3 is an enlarged cross-sectional view illustrating a focus ring in accordance with example embodiments of the invention.

FIG. 3 is an enlarged cross-sectional view illustrating a focus ring in accordance with example embodiments of the invention.

Referring to FIG. 3, the focus ring 350 may include a first ring 355, a second ring 360 and a third ring 365. The first ring 355 may make contact with a side of the substrate W. The second ring 360 may be coupled to the first ring 355. Further, the third ring 365 may be coupled to the second ring 360. Here, the first ring 355 may be referred to as an inner ring, the second ring 360 may be referred to as a first outer ring, and the third ring 365 may be referred to as a second outer ring. Although the focus ring 350 illustrated in FIG. 3 includes the first to the third rings 355, 360 and 365, the numbers of rings included in the focus ring 350 may vary in accordance with the dimensions of the apparatus for processing a substrate and/or the process conditions of the processes performed on the substrate W.

In example embodiments, the first ring 355 may have a height substantially smaller than a height of the second ring 360 and/or a height of the third ring 365. In this case, a coupling stepped structure may be provided at a lower portion of the first ring 355 for the stable coupling of the focus ring 350 relative to the substrate W and the dielectric plate 305. For example, the height of the first ring 355 may be decreased in a substantially stepwise manner toward the substrate W with which the first ring 355 may make contact. However, the second ring 360 may have the height substantially the same as the height of the third ring 365.

As for the focus ring 350 according to example embodiments, the third ring 365 may have an etching rate with respect to the plasma generated from the process gas in the process space 205, which may be different from etching rates of the first and the second rings 355 and 360. In other words, the first ring 355 may have a first etching rate relative to the plasma substantially the same as a second etching rate of the second ring 360 relative to the plasma while the third ring 365 may have a third etching rate relative to the plasma different from the first etching rate of the first ring 355 and the second etching rate of the second ring 360. For example, when the process gas introduced in the process space 205 includes fluorine (F), each of the first ring 355 and the second ring 360 may include silicon carbide (SiCx) and the third ring may include silicon oxide (SiOx) (for example, quartz). Therefore, with respect to the plasma generated from the process gas containing fluorine, the third ring 365 may have the third etching rate substantially higher than the first etching rate of the first ring 355 and the second etching rate of the second ring 360.

Generally, the focus ring disposed in the process chamber for the plasma etching process may include rings composed of different materials. As for the conventional focus ring including an inner ring and an outer ring, the etching rate of the inner ring relative to the plasma is different from the etching rate of the outer ring relative to the plasma so that damages may be caused centering around a portion of the focus ring where the inner ring makes contact with the outer ring (that is, an interface between the inner ring and the outer ring). The damages to the inner ring and the outer ring may be increased toward a side and/or a central portion of the focus ring as the focus ring is used in the plasma etching process, thereby reducing the lifetime of the focus ring.

According to example embodiments, the focus ring 350 may include a stepped structure provided between the second ring 360 and the third ring 365. Particularly, a stepped structure 370 may be formed at an interface between the second ring 360 and the third ring 365 such that the stepped structure 370 may be downwardly formed toward the substrate W surrounded by the focus ring 350. The position of such stepped structure 370 may be described as the stepped structure 370 is formed at a side of the second ring 360, or at a side of the third ring 365.

As illustrated in FIG. 3, the stepped structure 370 of the focus ring 350 may include a plurality of stepped portions. In particular, the stepped structure 370 may include a first stepped portion 373, a second stepped portion 376, a third stepped portion 379 and a fourth stepped portion 382, which may be downwardly formed toward the substrate W. Although FIG. 3 illustrates the stepped structure 370 including the first to the fourth stepped portions 373, 376, 379 and 382, the numbers of the stepped portions of the stepped structure 370 may vary depending on the structure and the use of the focus ring 350. In example embodiments, the focus ring 350 may have dimensions substantially the same as those of the conventional focus ring. For example, the sum of an upper width of the first ring 355 and an upper width of the second ring 360 may be substantially the same as an upper width of the inner ring of the conventional focus ring. Further, a lower width of the second ring 360 may be substantially the same as a lower width of the inner ring of the conventional focus ring. Therefore, the focus ring 350 may be easily installed in the conventional etching chamber without changing the structures and the dimensions of the components included in the conventional etching chamber. Further, the focus ring 350 according to example embodiments may have the dimensions substantially the same as those of the conventional focus ring so that the plasma etching process may be stably performed on the substrate W using the focus ring 350 without substantially changing the process conditions of the plasma etching process executed in the conventional etching chamber. That is, the focus ring 350 according to example embodiments may properly locate in the conventional etching chamber and may ensure the plasma etching process stably performed in the conventional etching chamber without modifying the configurations and the dimensions of the conventional etching chamber and the process conditions of the plasma etching process.

Referring now to FIG. 3, the first stepped portion 373 of the stepped structure 370 may have a first depth H1 from an upper face of the substrate W and a first width W1. The second stepped portion 376 may have a second depth H2 and a second width H2, and the third stepped portion 379 may have a third depth H3 and a third width W3. Additionally, the fourth stepped portion 382 may have a fourth depth H4 and a fourth width W4. In this case, a fifth depth H5 may be between the fourth stepped portion 382 and a bottom face of the focus ring 350.

In example embodiments, the first depth H1 of the first stepped portion 373 may be substantially smaller than the second depth H2 of the second stepped portion 376 whereas the first width W1 of the first stepped portion 373 may be substantially larger than the second width W2 of the second stepped portion 376. The second depth H2 of the second stepped portion 376 may be substantially smaller than the third depth H3 of the third stepped portion 379 while the second width W2 of the second stepped portion 376 may be substantially wider than the third width W3 of the third stepped portion 379. The third depth H3 of the third stepped portion 379 may be substantially smaller than the fourth depth H4 of the fourth stepped portion 382 while the third width W3 of the third stepped portion 379 may be substantially larger than the fourth width W4 of the fourth stepped portion 382. Further, the fifth depth H3 from the fourth stepped portion 382 to the bottom of the focus ring 350 may be substantially larger than the fourth depth H4 of the fourth stepped portion 382. In other words, the stepped structure 370 may include the first to the fourth stepped portions 373, 376, 379 and 382 which may have the first to the fourth depths H1, H2, H3, and H4 downwardly increased toward the substrate W and the first to the fourth widths W1, W2, W3 and W4 downwardly decreased toward the substrate W. The above-described stepped structure 370 may effectively prevent the focus ring 350 from being damaged by the plasma in the plasma etching process such that the focus ring 350 may ensure greatly improved etching resistance as well as considerably enhanced durability. As a result, the focus ring 350 may have considerably increased lifetime.

According to example embodiments, the focus ring 350 may have the stepped structure 370 including the stepped portions 373, 376, 379 and 382 having gradually increased depths toward the substrate W and gradually decreased widths toward the substrate W such that the propagation of damages toward the side and/or the center of the focus ring 350 may be effectively prevented even though the damages are generated by the plasma at the portion between the second ring 360 and the third ring 365 in the plasma etching process using the focus ring 350. Accordingly, the etching resistance and the durability the focus ring 350 including the above-described stepped portions 373, 376, 379 and 382 may be greatly enhanced. As a result, the process chamber 180 including the focus ring 350 and the apparatus for processing a substrate including the focus ring 350 may ensure considerably increased lifetimes, respectively.

In the plasma etching process performed using the plasma generated from the etching gas including fluorine, the lifetime of the focus ring including the inner ring of silicon carbide and the outer ring of silicon oxide with a height of about 8 mm and a diameter of about 40 mm had the lifetime of about 2,070 hours. On the other hand, the focus ring 350 including the above stepped structure 370 had the lifetime of about 6,790 hours three times greater than that of the conventional focus ring when the plasma etching process was performed using the plasma generated from the etching gas containing fluorine and using the focus ring 350 with a height and a diameter the same as those of the conventional focus ring. Here, the focus ring 350 included the first ring 355 composed of silicon carbide, the second ring 360 composed of silicon carbide and the third ring 365 composed of silicon oxide. Therefore, the focus ring 350 having the above stepped structure 370 showed the lifetime greatly larger than that of the conventional focus ring.

Referring now to FIG. 2, the gas supply unit 400 may provide the process gas onto the substrate W supported by the supporting unit 300. The gas supply unit 180 may include a gas reservoir 405 and a supply line 410. The supply line 410 may connect the gas reservoir 405 to a gas inlet port 415 provided at an upper portion of the housing 200. The process gas stored in the gas reservoir 405 may pass through the supply line 410 and the gas inlet port 415 and then may enter the process space 205 of the housing 200.

The plasma generating unit 500 may convert the process gas introduced in the housing 200 from the gas supply unit 400 into the plasma. For example, the plasma generating unit 500 may include a plasma source such as an induced-coupled plasma (ICP) source. The plasma generating unit 500 may include an antenna 505 and an external power source 510. Here, the external power source 510 may apply a power to the antenna 505. Thus, a discharge region may be formed in the process space 205 and the process gas introduced in the discharge region may be converted into the plasma.

The exhausting unit 600 may be disposed in the process space 205 and may be adjacent to the supporting unit 300. The exhausting unit 600 may include a plurality of exhausting holes 605 and the plasma may be partially discharged through the exhausting holes 605 such that the plasma may be uniformly distributed in the entire process space 205. For example, the exhausting unit 600 may have a substantial ring shape.

According to example embodiments, the focus ring may include the stepped portions having the depths downwardly increased toward the substrate and the widths downwardly decreased toward the substrate. Therefore, the propagation of damages toward the side and/or the center of the focus ring may be effectively prevented even though the damages generate by the plasma at the portion between the second ring and the third ring in the plasma etching process performed using the focus ring. Accordingly, the etching resistance and the durability the focus ring including the stepped portions may be greatly enhanced. As a result, the focus ring may ensure greatly increased lifetime and also the process chamber including the focus ring and the apparatus for processing a substrate including the focus ring may have considerably increased lifetimes, respectively.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A focus ring comprising:
a first ring contacting a substrate;
a second ring coupled to the first ring;
a third ring coupled to the second ring; and
a stepped structure provided between the second ring and the third ring, wherein the stepped structure is downwardly disposed towards the substrate and includes a plurality of stepped portions including a first stepped portion, a second stepped portion, a third stepped portion and a fourth stepped portion, which are downwardly disposed toward the substrate, and wherein the first to the fourth stepped portions have depths increased toward the substrate and widths decreased toward the substrate, respectively.

2. The focus ring of claim 1, wherein the first ring has a first etching rate, the second ring has a second etching rate, and the third ring has a third etching rate.

3. The focus ring of claim 2, wherein, with respect to an etching gas including flourine, the first etching rate is the same as the second etching rate, and the third etching rate is greater than the first etching rate and the second etching rate.

4. The focus ring of claim 2, wherein each of the first ring and the second ring includes silicon carbide and the third ring includes silicon oxide.

5. The focus ring of claim 1, wherein the stepped structure is formed at an interface between the second ring and the third ring, at a side of the second ring, or at a side of the third ring.

6. The focus ring of claim 1, wherein the first stepped portion has a first depth and a first width, the second stepped portion has a second depth greater than the first depth and a second width smaller than the first width, the third stepped portion has a third depth greater than the second depth and a third width smaller than the second width, and the fourth stepped portion has a fourth depth greater than the third depth and a fourth smaller than the third depth.

7. The focus ring of claim 1, wherein a coupling stepped structure is provided at a lower portion of the first ring for a stable coupling of the focus ring relative to the substrate.

8. A process chamber comprising:
a housing providing a process space therein;
a supporting unit disposed in the housing to support a substrate, the supporting unit including a focus ring having a plurality of rings;
a gas supply unit providing a process gas into the process space; and
a plasma generating unit generating a plasma from the process gas in the process space,
wherein the focus ring includes a stepped structure having a plurality of stepped portions downwardly provided toward the substrate, wherein the focus ring includes a first ring, a second ring coupled to the first ring, and a third ring coupled to the second ring, and the stepped structure is provided between the second ring and the third ring, wherein the stepped structure includes a first stepped portion, a second stepped portion, a third stepped portion, and a fourth stepped portion, which are downwardly disposed toward the substrate, and wherein the first to the fourth stepped portions have depths increased toward the substrate and widths decreased toward the substrate, respectively.

9. The process chamber of claim 8, wherein the stepped structure is formed at an interface between the second ring and the third ring, at a side of the second ring, or at a side of the third ring.

10. The process chamber of claim 8, wherein the first stepped portion has a first depth and a first width, the second stepped portion has a second depth greater than the first depth and a second width smaller than the first width, the third stepped portion has a third depth greater than the second depth and a third width smaller than the second width, and the fourth stepped portion has a fourth depth greater than the third depth and a fourth smaller than the third depth.

11. An apparatus for processing a substrate, which comprises:
a processing module including at least one process chamber for performing a desired process on a substrate; and
an index module transferring the substrate into the processing module from an outside, the at least one process chamber comprising:
a housing providing a process space therein;
a supporting unit disposed in the housing to support a substrate, the supporting unit including a focus ring having a plurality of rings;
a gas supply unit providing a process gas into the process space; and
a plasma generating unit generating a plasma from the process gas in the process space,
wherein the focus ring includes a stepped structure having a plurality of stepped portions downwardly provided toward the substrate, wherein the stepped structure includes a first stepped portion, a second stepped portion, a third stepped portion, and a fourth stepped portion, which are downwardly disposed toward the substrate, and wherein the first stepped portion to the fourth stepped portion have depths increased toward the substrate and widths decreased toward the substrate, respectively.

* * * * *